(12) United States Patent
Nishizawa et al.

(10) Patent No.: US 10,712,287 B2
(45) Date of Patent: Jul. 14, 2020

(54) INSPECTION DEVICE AND INSPECTION METHOD

(71) Applicant: Lasertec Corporation, Yokohama (JP)

(72) Inventors: Masayasu Nishizawa, Yokohama (JP); Haruhiko Kusunose, Yokohama (JP); Tomohiro Suzuki, Yokohama (JP)

(73) Assignee: LASERTEC CORPORATION, Yokohama (JP)

( * ) Notice: Subject to any disclaimer, the term of this patent is extended or adjusted under 35 U.S.C. 154(b) by 5 days.

(21) Appl. No.: 16/295,870

(22) Filed: Mar. 7, 2019

(65) Prior Publication Data

US 2019/0277772 A1    Sep. 12, 2019

(30) Foreign Application Priority Data

Mar. 8, 2018 (JP) ................................. 2018-041993

(51) Int. Cl.
  *G01N 21/88* (2006.01)
  *G01N 21/956* (2006.01)
  (Continued)

(52) U.S. Cl.
  CPC ....... *G01N 21/8806* (2013.01); *G01N 21/956* (2013.01); *G03F 7/70483* (2013.01);
  (Continued)

(58) Field of Classification Search
  CPC ..... G01N 2021/95676; G01N 21/8806; G01N 21/93; G01N 21/956; G01N 2201/061;
  (Continued)

(56) References Cited

U.S. PATENT DOCUMENTS

| 7,463,350 B2 * | 12/2008 | Nishiyama ....... G01N 21/95684 |
| | | 356/237.4 |
| 2005/0196059 A1 | 9/2005 | Inoue et al. |

(Continued)

FOREIGN PATENT DOCUMENTS

| JP | H08334315 A | 12/1996 |
| JP | H11311608 A | 11/1999 |

(Continued)

OTHER PUBLICATIONS

Mizoguchi, H. et al., "Short wavelength light source for semiconductor manufacturing: Challenge from excimer laser to LPP-EUV light source," Komatsu Technical Report, vol. 62, No. 169, Mar. 27, 2017, 12 pages. (Submitted with English Abstract).

(Continued)

*Primary Examiner* — Marcus H Taningco
(74) *Attorney, Agent, or Firm* — McCoy Russell LLP

(57) ABSTRACT

An inspection device according to the present disclosure includes a detector for inspection that includes a plurality of pixels arranged on a light receiving surface and acquires image data by transferring charge produced by light received by the plurality of pixels in a transfer direction at a specified transfer timing, a light source that emits illumination light including pulsed light, a pulse enable circuit that controls emission timing for the light source to emit the illumination light based on the transfer timing, an illumination optical system that illuminates an object to be inspected with the illumination light, a condensing optical system that condenses, on the detector for inspection, light from the object to be inspected illuminated with the illumination light, and a processing unit that inspects the object to be inspected by using the image data of the object to be inspected.

12 Claims, 16 Drawing Sheets

(51) Int. Cl.
*H05G 2/00* (2006.01)
*G03F 7/20* (2006.01)

(52) U.S. Cl.
CPC .............. *H05G 2/003* (2013.01); *H05G 2/008* (2013.01); *G01N 2021/95676* (2013.01); *G01N 2201/061* (2013.01)

(58) Field of Classification Search
CPC .... G03F 7/70483; H05G 2/003; H05G 2/005; H05G 2/008
See application file for complete search history.

(56) References Cited

U.S. PATENT DOCUMENTS

| | | |
|---|---|---|
| 2009/0040513 A1 | 2/2009 | Abe et al. |
| 2010/0060890 A1 | 3/2010 | Tsuchiya et al. |
| 2010/0165310 A1* | 7/2010 | Sewell ................... G03B 27/42 355/53 |
| 2015/0076359 A1* | 3/2015 | Bykanov .............. G01N 21/956 250/372 |
| 2015/0179401 A1* | 6/2015 | Gambino ............ H01J 37/3045 250/573 |
| 2015/0260659 A1* | 9/2015 | Chuang ............. H01L 27/14689 250/370.08 |
| 2017/0176879 A1* | 6/2017 | Witte ..................... H05G 2/008 |
| 2019/0331611 A1* | 10/2019 | Ebstein .............. G02B 21/0056 |

FOREIGN PATENT DOCUMENTS

| | | |
|---|---|---|
| JP | 2005241290 A | 9/2005 |
| JP | 2009075068 A | 4/2009 |
| JP | 2010091552 A | 4/2010 |

OTHER PUBLICATIONS

Japanese Patent Office, Office Action Issued in Application No. 2018041993, dated Aug. 14, 2018, 7 pages.

* cited by examiner

INSPECTION DEVICE AND INSPECTION METHOD

CROSS REFERENCE TO RELATED APPLICATIONS

The present application claims priority to Japanese Application No. 2018-041993 entitled "INSPECTION DEVICE AND INSPECTION METHOD," filed Mar. 8, 2018. The entire contents of the above-listed application are hereby incorporated by reference in their entirety for all purposes.

BACKGROUND

The present disclosure relates to an inspection device and an inspection method, and particularly relates to an inspection device and an inspection method for inspecting an object to be inspected by using a pulsed light source.

A high-intensity pulsed light source is used in some cases for inspection of a mask for EUV (Extreme Ultra Violet) lithography (which is referred to hereinafter as EUV mask), for example, in order to improve the accuracy of inspection. Further, critical illumination is used in some cases in order to ensure the luminance of illumination light. Critical illumination is a method of illumination for forming an image of a light source on the top surface of an EUV mask, and it is an optical system achieving bright illumination.

Further, when detecting image data for inspection, in some cases an area sensor operates in TDI (Time Delay Integration) mode that transfers the pixel values of a two-dimensional (X-Y direction) area sensor in synchronization with the stage in the X direction and conducts time delay integration of the obtained pixel values. Use of the TDI mode compensates for the lack of sensitivity of the sensor and achieves highly sensitive imaging of a mask pattern.

One of EUV light sources that have been put into practical use recently is an LPP (LASER Produced Plasma) EUV light source as described in Hakaru Mizoguchi et al. "Short wavelength light source for semiconductor manufacturing: Challenge from excimer laser to LPP-EUV light source" Komatsu Technical Report March 2017, Vol. 62, No. 169, P. 27. An LPP-EUV light source is a pulsed light source that applies plasma-producing laser light to a tin droplet discharged from a droplet generator and uses EUV light produced from tin that has turned into plasma.

The LPP-EUV light source has characteristics that, while the position of a light emitting point of plasma emission and the spatial distribution of luminance (which is referred to hereinafter as luminance distribution) are stable, its emission luminance varies from pulse to pulse due to various reasons such as intensity fluctuation of plasma-producing laser light and size fluctuation of droplets, as described later. Further, because its emission timing is determined by an oscillator in the LPP-EUV light source, it cannot be determined using an external trigger signal. Furthermore, the emission period of the LPP-EUV light source has a relatively large jitter $\sigma_S$. The size of the jitter $\sigma_S$ is the same or greater than the transfer period of TDI.

FIG. 1 is a view illustrating the luminance distribution of illumination light in the visual field of an area sensor when an area illuminated with an LPP-EUV light source is observed using the area sensor through an inspection optical system. FIG. 1 shows the case (a) where the luminance distribution is uniform and the case (b) where the luminance distribution is concentric. The luminance distribution of illumination light in the visual field of an area sensor tends to be non-uniform as shown in FIG. 1(b) particularly when critical illumination is employed in an illumination optical system of an inspection device.

Specifically, in the case of using an LPP-EUV light source as a light source of a lithography mask inspection device, its illumination light has characteristics that the luminance distribution is not uniform in the visual field of an area sensor, the illumination luminance varies from pulse to pulse, and the pulse emission period fluctuates. Note that, however, the position of the center of gravity of the luminance distribution is fixed and does not move for each pulse.

The lithography mask inspection device compares an inspection image taken with design data or a reference image obtained by taking an image of the same pattern on a specimen and, when they do not match, determines that there is pattern defect.

For accurate and stable pattern defect inspection, an inspection mage preferably has spatially uniform intensity distribution and is illuminated with stable illumination light whose intensity does not vary over time. When the intensity of illumination light varies over position or time, unintended variation in luminance (artifact) occurs in a mask pattern image taken, which causes an error in determination of pattern defect. There is thus a need to detect the luminance of a light source in some way and correct output fluctuation in a TDI sensor.

In the case of using a pulsed light source having characteristics that, while the positional stability of a light emitting spot is high enough, the luminance distribution is not uniform in the observation visual field, the illumination luminance varies from pulse to pulse, and the pulse emission period fluctuates, such as an LPP-EUV light source, as an illumination light source in an inspection device and using a TDI sensor as a detector that acquires image data of an object to be inspected, the following two problems need to be addressed in relation to luminance correction of illumination light.

A first problem is caused by the fact that the luminance distribution of illumination light in the visual field of a TDI sensor is not uniform as shown in FIG. 1(b). Japanese Unexamined Patent Application Publication No. 2010-091552 discloses a method that places a light quantity sensor (e.g., photodiode) for correction to detect the quantity of pulsed light and measures the entire light quantity of each pulse in synchronization with the period of pulsed light and thereby corrects the output fluctuation in the TDI sensor. However, when the luminance distribution of illumination light is not uniform, the luminance of illumination light varies depending on a light receiving spot on the TDI sensor, and therefore an error occurs in luminance correction in the method of Japanese Unexamined Patent Application Publication No. 2010-091552.

When the luminance distribution of illumination light in the visual field of a TDI sensor is not uniform, the luminance distribution may be detected using a detector having high position resolution such as a second TDI sensor, for example; however, use of the second TDI sensor complicates the optical system.

A second problem is caused by the fact that the emission timing of pulsed light emitted from a light source cannot be controlled by an external signal and that the emission period contains jitter that is the same or greater than the transfer period of TDI. FIG. 2 is a view illustrating the transfer timing of a TDI sensor and the emission timing of a light source that emits pulsed light. An inspection device using a light source that emits pulsed light and a TDI sensor generally measures the moving distance of a stage in uniform motion with a object to be inspected placed thereon and controls the transfer timing of the TDI sensor and the emission timing of the pulsed light source based on a result of the measurement. At this time, as shown in (a) of FIG. 2, the emission timing ($t_0$ or $t_1$) of pulsed light is synchronously-controlled to have a certain time difference $T_D$ with respect to the transfer timing of the TDI sensor.

However, as shown in (b) of FIG. 2, when the emission period Ts of pulsed light emitted from the light source contains jitter $\sigma_S$, synchronous control for maintaining a constant time difference $T_D$ between the transfer timing of the TDI sensor and the emission timing of pulsed light cannot be carried out, which causes overlap of the transfer timing of the TDI sensor and the emission timing of pulsed light. When the overlap between the transfer timing and the emission timing occurs, charge to be accumulated in one pixel is split into two pixels. This causes an error in luminance correction.

FIG. 3 is a view illustrating the transfer timing of the TDI sensor, the operation of the TDI sensor, the timing of an emission trigger signal, and the emission intensity of a light source. As shown in FIG. 3, the TDI sensor starts transfer operation upon input of a clock pulse indicating the transfer timing to the TDI sensor. The period of a clock pulse indicating the transfer timing of the TDI sensor is a transfer period $\tau_{Ti}$. The transfer period $\tau_{Ti}$ is needed for the transfer operation of the TDI sensor.

As described earlier, the emission timing of the light source is generally controlled by an external synchronizing signal so as to have a certain time difference with respect to the transfer timing of the TDI sensor. Specifically, a clock pulse indicating the emission timing (emission trigger signal) is given with a time difference $\tau_D$ with respect to a clock pulse indicating the transfer timing. Receiving the clock pulse indicating the emission timing, the light source generates pulsed light. The duration of pulsed light is duration $\tau_p$. The value of $\tau_D$ is set to the following range, and therefore the transfer period $\tau_{Ti}$ and the duration $\tau_p$ do not overlap.

$$\tau_{Ti} < \tau_D < \tau_{Ti} - \tau_p$$

On the other hand, when the emission timing of a light source has jitter that is the same or greater than the transfer period $\tau_{Ti}$ of the TDI, and a time difference between the transfer timing and the timing of emitting illumination light including pulsed light cannot be kept constant, the transfer timing of the TDI sensor and the emission timing of pulsed light overlap in some cases. To be specific, when an input time of a clock pulse indicating the transfer timing of the TDI sensor is $\tau_{t0}$, the transfer period $\tau_{Ti}$ and the duration $\tau_p$ overlap if the emission timing $t_p$ of the light source falls within the following time range.

$$\tau_{t0} - \tau_p < t_p < t_{t0} + \tau_{Ti}$$

When the transfer timing of the TDI sensor and the emission timing of pulsed light overlap as described above, the amount of light to be accumulated in one pixel is split into two pixels. This causes an error in luminance correction. To prevent the occurrence of such an error, jitter $\sigma_S$ of the pulse emission timing needs to be sufficiently less than the exposure time (=transfer period $\tau_{Ti}$) of one pixel in the transfer direction of the TDI sensor ($\sigma_S \ll \tau_{Ti}$).

However, because the jitter $\sigma_S$ of the same or greater than the transfer period of the TDI sensor exists at the emission timing of an LPP-EUV light source 11, the emission timing of the LPP-EUV light source 11 fluctuates over several pixels in the transfer direction of the TDI sensor ($\sigma_S$ to $\tau_{Ti}$). In this case, the transfer timing of the TDI sensor and the emission timing of pulsed light overlap, which increases an error in luminance correction.

The present disclosure has been accomplished to solve the problem of an error in luminance correction caused by luminance distribution of illumination light and overlap of transfer timing and emission timing, and provides an inspection device and an inspection method that enable accurate luminance correction and accurate inspection of an object to be inspected even with use of a simple detector with low position resolution.

SUMMARY

An inspection device according to the present disclosure includes a detector for inspection configured to include a plurality of pixels arranged on a light receiving surface including a transfer direction and a direction orthogonal to the transfer direction, and acquire image data by transferring charge produced by light received by the plurality of pixels in the transfer direction at a specified transfer timing, a light source configured to emit illumination light including pulsed light, a pulse enable circuit configured to control an emission timing for the light source to emit the illumination light based on the transfer timing, an illumination optical system configured to illuminate an object to be inspected with the illumination light, a condensing optical system configured to condense, on the detector for inspection, light from the object to be inspected illuminated with the illumination light, and a processing unit configured to inspect the object to be inspected by using the image data of the object to be inspected. In this structure, because the transfer timing and the emission timing do not overlap, it is possible to acquire highly accurate image data and inspect an object to be inspected with high accuracy.

The light source is an LPP light source configured to emit the illumination light by applying laser light to a droplet generated at a generation timing asynchronous to the transfer timing, and the pulse enable circuit controls the emission timing by controlling application of the laser light. In this structure, even when the luminance of the illumination light varies with time, the luminance distribution of the illumination light does not substantially vary with time. It is thereby possible to correct the luminance of the illumination light with high accuracy.

The inspection device further includes a monitor unit configured to acquire luminance of the illumination light detected by illuminating a detector for correction with a part of the illumination light, wherein the processing unit corrects the image data of the object to be inspected by using a previously measured luminance distribution of the illumination light on the light receiving surface and luminance of the illumination light at the emission timing acquired by the detector for correction, and the processing unit inspects the object to be inspected by using the corrected image data of the object to be inspected. In this structure, it is possible to carry out luminance correction accurately even with use of a simple detector for correction.

The processing unit includes a position recording shift register configured to record positions of the plurality of pixels arranged in the transfer direction at the emission timing, and a luminance register configured to record luminance of the illumination light at the emission timing, wherein the processing unit corrects the image data of the object to be inspected by using the previously measured luminance distribution of the illumination light on the light receiving surface, positions of pixels recorded in the position recording shift register, and luminance of the illumination light recorded in the luminance register. Because the position recording shift register and the luminance register record light receiving pixel positions and luminance at emission timing, it is possible to accurately acquire the luminance in light receiving pixels from their values and thereby achieve accurate luminance correction.

The processing unit includes a plurality of the position recording shift registers and a plurality of the luminance registers corresponding to a plurality of pulsed light emitted from the light source during a time of integration of charge of the plurality of pixels, the processing unit shifts positions of the respective pixels recorded in each of the position recording shift registers in the transfer direction in synchronization with the transfer timing, and the processing unit corrects image data of the object to be inspected by using the positions shifted and output in each of the position recording shift registers, luminance of the illumination light recorded in each of the luminance registers, and the previously measured luminance distribution of the illumination light on the light receiving surface. It is thus possible to accurately acquire the luminance at light receiving pixel positions for each pulse of a plurality of pulsed light emitted from the light source during an integration time and thereby achieve accurate luminance correction.

The detector for inspection is a detector including a TDI sensor, and the detector for correction is a detector including a photodiode. It is thereby possible to acquire highly accurate image data and achieve accurate luminance correction with use of a simple detector.

An inspection method according to the present disclosure includes a step of preparing a detector for inspection configured to include a plurality of pixels arranged on a light receiving surface including a transfer direction and a direction orthogonal to the transfer direction, and acquire image data by transferring charge produced by light received by the plurality of pixels in the transfer direction at a specified transfer timing, a step of preparing a light source configured to emit illumination light including pulsed light, a step of emitting the illumination light from the light source while controlling emission timing for the light source to emit the illumination light based on the transfer timing, a step of illuminating an object to be inspected with the illumination light, a step of condensing, on the detector for inspection, light from the object to be inspected illuminated with the illumination light, and a step of inspecting the object to be inspected by using the image data of the object to be inspected. In this structure, because the transfer timing and the emission timing do not overlap, it is possible to acquire highly accurate image data and inspect an object to be inspected with high accuracy.

The step of preparing a light source configured to emit illumination light including pulsed light prepares an LPP light source configured to emit the illumination light by applying laser light to a droplet generated at a generation timing asynchronous to the transfer timing, and the step of emitting the illumination light controls the emission timing by controlling application of the laser light. In this structure, even when the luminance of the illumination light varies with time, the luminance distribution of the illumination light does not substantially vary with time. It is thereby possible to correct the luminance of the illumination light with high accuracy.

The inspection method further includes a step of preparing a detector for correction configured to acquire luminance of the illumination light, a step of acquiring luminance of the illumination light by illuminating the detector for correction with a part of the illumination light, and a step of correcting the image data of the object to be inspected by using a previously measured luminance distribution of the illumination light on the light receiving surface and luminance of the illumination light at the emission timing acquired by the detector for correction, wherein the step of inspecting the object to be inspected inspects the object to be inspected by using the corrected image data of the object to be inspected. In this structure, it is possible to carry out luminance correction accurately even with use of a simple detector for correction.

The step of correcting the image data of the object to be inspected prepares a position recording shift register configured to record positions of the plurality of pixels arranged in the transfer direction at the emission timing, and a luminance register configured to record luminance of the illumination light at the emission timing, and corrects the image data of the object to be inspected by using a previously measured luminance distribution of the illumination light on the light receiving surface, positions of pixels recorded in the position recording shift register, and luminance of the illumination light recorded in the luminance register. Because the position recording shift register and the luminance register record light receiving pixel positions and luminance at emission timing, it is possible to accurately acquire the luminance in light receiving pixels from their values and thereby achieve accurate luminance correction.

The step of correcting the image data of the object to be inspected prepares a plurality of the position recording shift registers and a plurality of the luminance registers corresponding to a plurality of pulsed light emitted from the light source during a time of integration of charge of the plurality of pixels, shifts positions of the respective pixels recorded in each of the position recording shift registers in the transfer direction in synchronization with the transfer timing, and corrects image data of the object to be inspected by using the positions shifted and output in each of the position recording shift registers, luminance of the illumination light recorded in each of the luminance registers, and the previously measured luminance distribution of the illumination light on the light receiving surface. It is thus possible to accurately acquire the luminance at light receiving pixel positions for each pulse of a plurality of pulsed light emitted from the light source during an integration time and thereby achieve accurate luminance correction.

The detector for inspection is a detector including a TDI sensor, and the detector for correction is a detector including a photodiode. It is thereby possible to acquire highly accurate image data and achieve accurate luminance correction with use of a simple detector.

According to the present disclosure, there are provided an inspection device and an inspection method that enable accurate inspection of an object to be inspected.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

A specific structure of the present disclosure will be described hereinbelow with reference to the drawings. The explanation provided hereinbelow merely illustrates preferred embodiments of the present disclosure, and the present disclosure is not limited to the below-described embodiments. In the following description, the identical reference symbols denote substantially identical elements.

EMBODIMENT

An inspection device and an inspection method according to an embodiment are described hereinafter. The structure of an inspection device is described first. An inspection method using the inspection device is described after that.

Structure of Inspection Device

Figure 1:
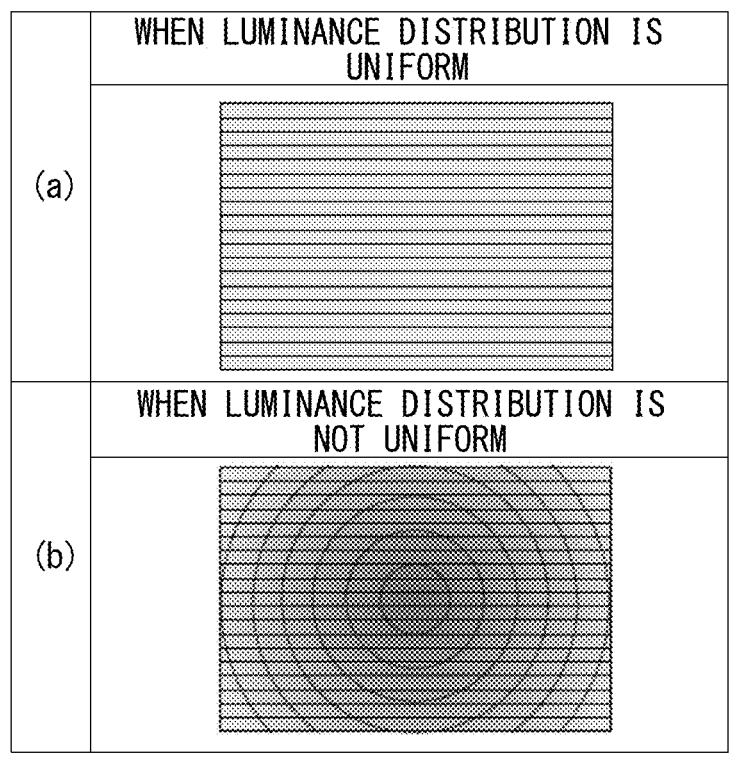
FIG. 1 is a view illustrating the luminance distribution of illumination light in the visual field of a TDI sensor.
Figure 2:
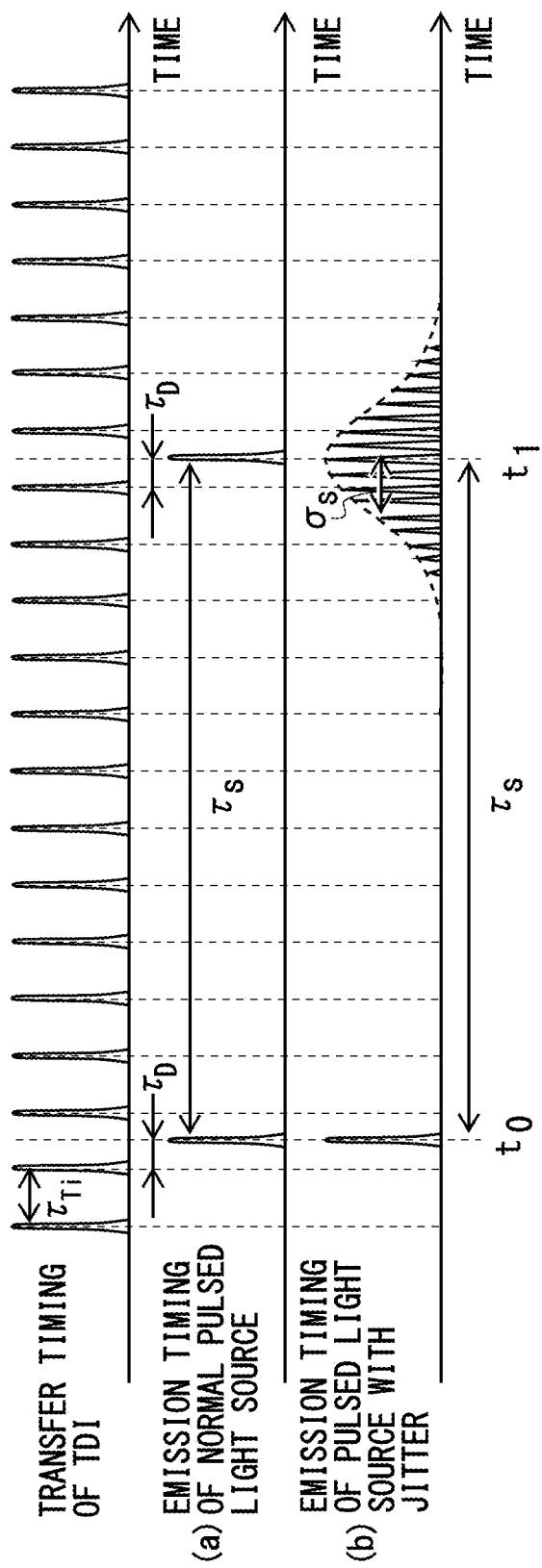
FIG. 2 is a view illustrating the transfer timing of a TDI sensor and the emission timing of a light source that emits pulsed light.
Figure 3:
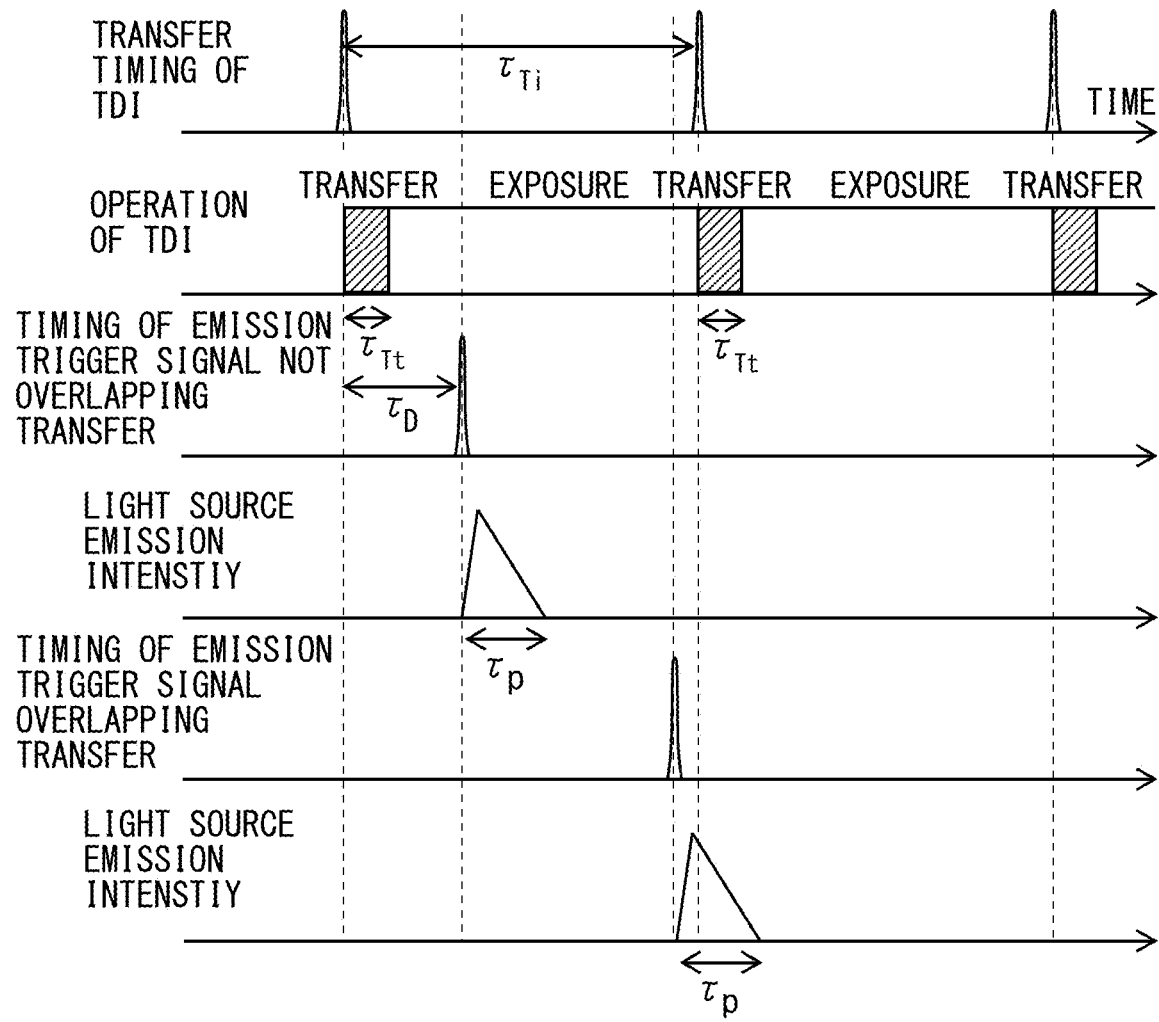
FIG. 3 is a view illustrating the transfer timing of a TDI sensor, the operation of the TDI sensor, the timing of an emission trigger signal, and the emission intensity of a light source.
Figure 4:
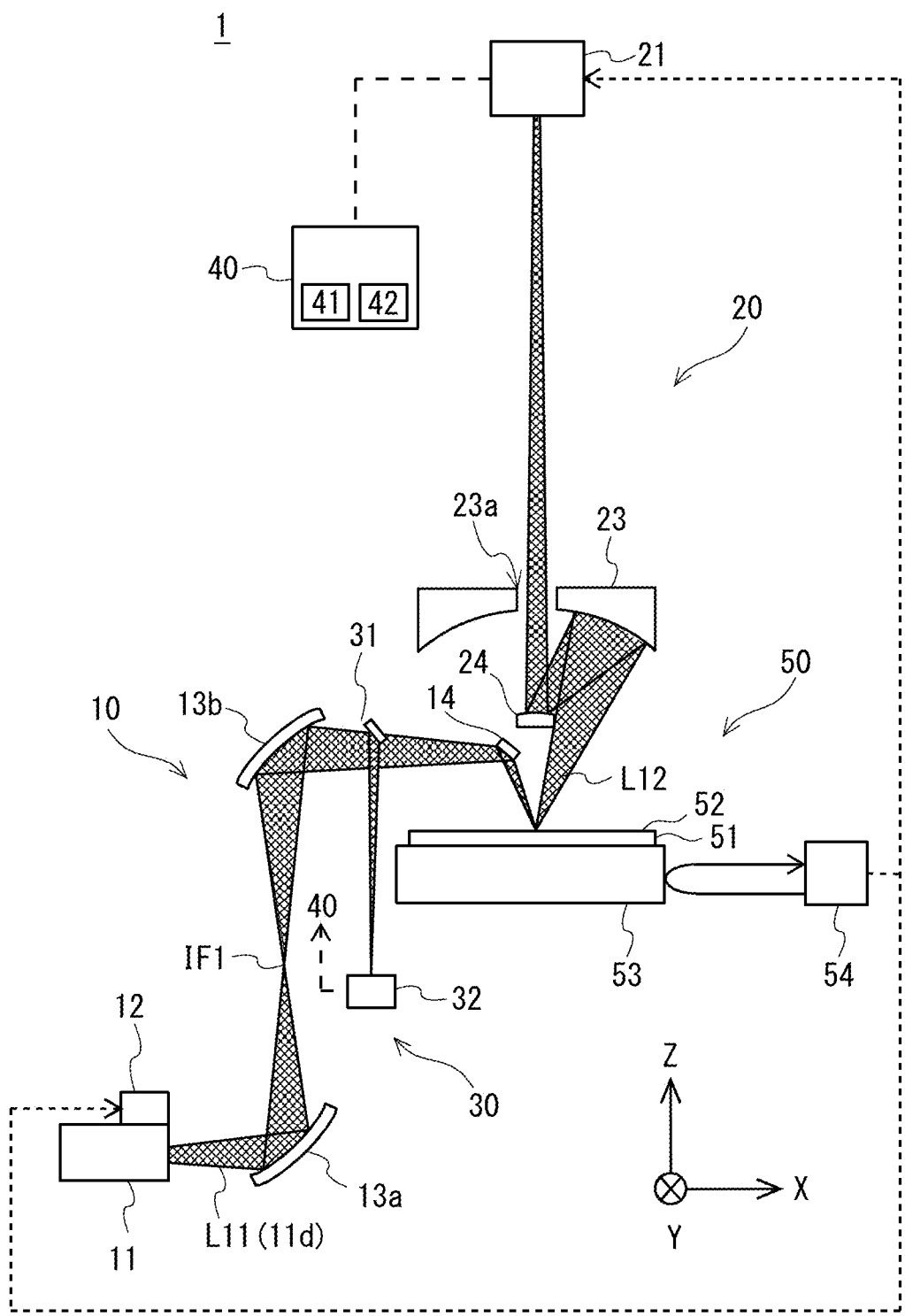
FIG. 4 is a view illustrating the structure of an inspection device according to an embodiment.

The structure of an inspection device according to this embodiment is described hereinafter. FIG. 4 is a view showing the structure of an inspection device according to the embodiment. As shown in FIG. 4, an inspection device 1 includes an illumination optical system 10, a light source 11, a pulse enable circuit 12, a condensing optical system 20, a detector 21 for inspection, a monitor unit 30, a processing unit 40, and a stage unit 50. The illumination optical system 10 includes an ellipsoid mirror 13a, an ellipsoid mirror 13b, and a dropping mirror 14. The condensing optical system 20 includes a concave mirror 23 with hole, and a convex mirror 24. The concave mirror 23 with hole and the convex mirror 24 form a Schwarzschild magnifying optical system. The monitor unit 30 includes a cut mirror 31 and a detector 32 for correction. The processing unit 40 may include a position recording shift register 41 and a luminance register 42. The stage unit 50 includes a stage 53 and a distance meter 54.

The inspection device 1 detects image data of an object 51 to be inspected, and inspects the object 51 by using the detected image data. The object 51 to be inspected is an EUV mask, for example. The object 51 to be inspected, however, is not limited to an EUV mask.

The light source 11 emits illumination light L11 containing pulsed light 11d. The illumination light L11 contains EUV light, for example. The illumination light L11 may contain EUV light with a wavelength of 13.5 nm, which is the same as the exposure wavelength of an EUV mask serving as the object 51 to be inspected. The light source 11 is an LPP light source 11, for example.

Figure 5:
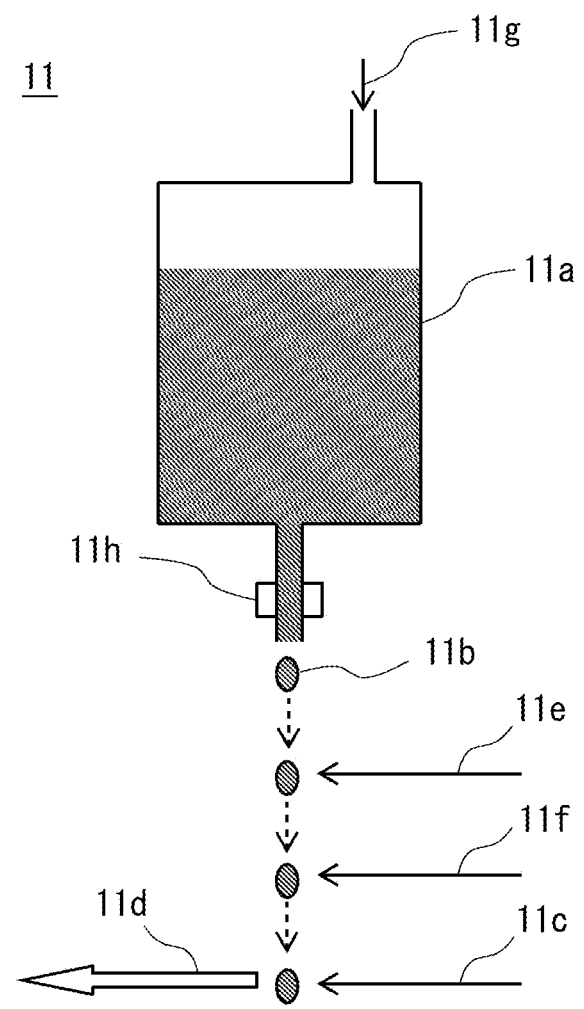
FIG. 5 is a view illustrating an LPP-EUV light source.

FIG. 5 is a view illustrating an LPP-EUV light source. As shown in FIG. 5, the LPP-EUV light source has a droplet generator (DG) 11a where tin is stored inside. The DG 11a is heated above the melting point of tin, and the stored tin is liquefied. Gas 11g is introduced into the DG 11a to apply pressure inside it. By this pressure, liquid tin is discharged at a certain rate through an outlet at the bottom, and a tin droplet 11b is formed. This tin droplet 11b is irradiated with plasma-producing laser light 11c at a certain position. Given the energy of the plasma-producing laser light 11c, the droplet 11b turns into plasma and emits EUV pulsed light 11d.

A piezoelectric element 11h is placed at the outlet of the DG 11a to make the outlet oscillate, thereby controlling the size and the release period of the droplet 11b. Although the release period is about several tens μs to several hundreds μs, it has jitter $\sigma_S$ of several μs or more, and the size of this jitter is the same or greater than the transfer period (about several μs) of the TDI.

The droplet 11b is irradiated with detection laser light 11e and detection laser light 11f for detecting the passage of the droplet 11b at two different points on the path where the droplet 11b flies to a condensing point of the plasma-producing laser light 11c. Because the distance between the detection laser light 11e and the detection laser light 11f is known, the velocity of the droplet 11b is calculated by measuring the time when the droplet 11b passes each of the positions. Based on the calculated velocity of the droplet 11b, the time when the droplet 11b reaches the condensing point of the plasma-producing laser light 11c is predicted, and an emission trigger is given to the plasma-producing laser light source in synchronization with this time, and thereby the light source applies the plasma-producing laser light 11c.

The plasma-producing laser light 11c is applied timely so as to irradiate the center of the droplet 11b, and therefore the center of gravity of the luminance distribution is substantially fixed at the condensing spot of the plasma-producing laser light 11c, and the luminance distribution of the pulsed light 11d is uniform. Note that, however, the EUV emission luminance can vary from pulse to pulse due to various reasons such as intensity fluctuation of the plasma-producing laser light 11c and size fluctuation of the droplet 11b.

The pulse enable circuit 12 controls whether the light source 11 emits the illumination light L11 or not. To be specific, in the case where a TDI sensor is used as the detector 21 for inspection, the pulse enable circuit 12 compares the transfer timing of the TDI sensor with the pulse emission timing of the light source 11, which is asynchronous to the transfer timing, and controls the light source 11 to emit light only at the timing when they do not overlap.

In the case where the light source 11 is an LPP type, the timing of generating the droplet 11b is determined by the release period of the DG. Thus, the pulse enable circuit 12 predicts the next emission timing based on a signal from the detector that detects the passage of the droplet 11b and compares the predicted emission timing with the next transfer timing of the TDI sensor, and when they do not overlap, an emission trigger is given to the plasma-producing laser light source to apply the plasma-producing laser light 11c and emit the illumination light L11.

As described above, the light source 11 is an LPP type that applies laser light to the droplet 11b generated at the generation timing asynchronous to the transfer timing and thereby emits the illumination light L11. The pulse enable circuit 12 controls application of laser light based on the transfer timing and thereby controls the emission timing. The pulse enable circuit 12 causes the light source 11 to emit the illumination light L11 only when it determines to allow the light source 11 to emit the illumination light L11.

The illumination light L11 generated by the light source 11 is reflected by the ellipsoid mirror 13a. The illumination light L11 reflected by the ellipsoid mirror 13a narrows down as it travels, and then condenses at a condensing point IF 1. The condensing point IF 1 is placed at a conjugated position with a top surface 52 of the EUV mask.

After passing the condensing point IF 1, the illumination light L11 spreads out as it travels and is then incident on a reflecting mirror such as the ellipsoid mirror 13b. The illumination light L11 incident on the ellipsoid mirror 13b is reflected by the ellipsoid mirror 13b, narrows down as it travels and is then incident on the dropping mirror 14. Thus, the ellipsoid mirror 13b allows the illumination light L11 to be incident on the dropping mirror 14 as converging light. The dropping mirror 14 is placed above the EUV mask that serves as the object 51 to be inspected. The illumination light L11 incident on and reflected by the dropping mirror 14 is then incident on the EUV mask.

The ellipsoid mirror 13b condenses the illumination light L11 on the EUV mask. The illumination optical system 10 may be set up so as to form an image of the light source 11 on the top surface 52 of the EUV mask when the illumination light L11 illuminates the EUV mask. In this case, the illumination optical system 10 is critical illumination. As described above, the illumination optical system 10 illuminates the object 51 to be inspected with the illumination light L11 containing pulsed light emitted from the light source 11. The illumination optical system 10 may illuminate an object to be inspected with use of critical illumination by the illumination light L11. Note that the illumination optical system 10 may illuminate an object to be inspected without use of critical illumination.

The EUV mask, which is the object 51 to be inspected, is placed on the stage 53. It is assumed that a plane parallel to the top surface 52 of the EUV mask is an X-Y plane, and the direction perpendicular to the X-Y plane is a Z direction. The illumination light L11 is incident on the EUV mask from the direction tilted with respect to the Z direction. Stated differently, the illumination light L11 illuminates the EUV mask by oblique incidence.

The stage 53 is an XYZ drive stage. Moving the stage 53 in the X-Y direction enables illumination of a desired area of the EUV mask. Further, moving the stage 53 in the Z direction enables focus adjustment.

When performing mask inspection, the stage 53 moves at a constant speed for scanning an inspection area. This speed is determined by a measurement result of the average emission period of the light source 11 within a specified time, the size of each pixel of the detector 21 for inspection, and the optical magnification of the condensing optical system 20. Further, the distance meter 54 generates a pulse indicating the transfer timing of the detector 21 for inspection. To be specific, the distance meter 54 measures the position of the stage 53, and generates a pulse indicating the transfer timing of the detector 21 for inspection each time an image of the object 51 to be inspected formed on the detector 21 for inspection moves by the distance corresponding to one pixel of the detector 21 for inspection.

The illumination light L11 emitted from the light source 11 illuminates an inspection area of the EUV mask. Reflected light L12 that is incident from the direction tilted with respect to the Z direction and reflected by the EUV mask is then incident on the concave mirror 23 with hole. The concave mirror 23 with hole has a hole 23a at its center.

The reflected light L12 reflected by the concave mirror 23 with hole is incident on the convex mirror 24. The convex mirror 24 reflects the reflected light L12 incident from the concave mirror 23 with hole towards the hole 23a of the concave mirror 23 with hole. The reflected light L12 having passed through the hole 23a is detected by the detector 21 for inspection. In this manner, the condensing optical system 20 condenses, on the detector 21 for inspection, the light from the object 51 to be inspected illuminated with the illumination light L11.

The detector 21 for inspection is a detector including a TDI sensor, for example, and acquires image data of the EUV mask, which is the object 51 to be inspected. The detector 21 for inspection includes a plurality of pixels arranged on a light receiving surface. The plurality of pixels of the detector 21 for inspection are arranged in one direction and another direction orthogonal to the one direction on the light receiving surface. The one direction is the transfer direction, for example. The detector 21 for inspection transfers charge produced by light received by the plurality of pixels in the transfer direction at the transfer timing generated by the distance meter 54 and thereby acquires image data.

To be specific, the detector 21 for inspection accumulates, as charge, light energy received within an exposure time in a certain pixel, and transfers the charge to the next pixel during transfer operation. In the pixel to which the charge is transferred, the detector 21 for inspection further accumulates light energy as charge. The detector 21 for inspection repeats this operation. The detector 21 for inspection periodically transfers charge in the transfer direction. A period of transfer by the detector 21 for inspection is referred to as a transfer period $\tau_{Ti}$. The number of pixels in the transfer direction of the detector 21 for inspection is referred to as the number of pixels in the transfer direction. The TDI sensor includes a CCD (Charge Coupled Device), for example. Note that, however, the TDI sensor does not necessarily include a CCD.

The monitor unit 30 acquires the luminance of the illumination light L11 detected by irradiating the detector 32 for correction with a part of the illumination light L11. The monitor unit 30 can thereby acquire the luminance of the illumination light L11 detected by critical illumination using a part of the illumination light L11. Note that the monitor unit 30 may acquire the luminance of the illumination light L11 without use of critical illumination. Luminance data of the illumination light L11 acquired by the detector 32 for correction is output to the processing unit 40.

The cut mirror 31 of the monitor unit 30 is placed between the ellipsoid mirror 13 and the dropping mirror 14, for example, and extracts a part of the illumination light L11 between the ellipsoid mirror 13 and the dropping mirror 14. The cut mirror 31 reflects the illumination light L11 so as to slightly cut a partial beam of the illumination light L11. A partial beam is the upper part of the beam, for example. The illumination light L11 reflected by the cut mirror 31 narrows down as it travels and is then incident on the detector 32 for correction. The detector 32 for correction is a detector including a photodiode, and acquires the luminance of received light. The detector 32 for correction does not necessarily have high position resolution.

The processing unit 40 inspects the object 51 to be inspected by using the image data of the object 51 to be inspected acquired by the detector 21 for inspection. Further, the processing unit 40 corrects the image data of the object to be inspected by using the previously measured luminance distribution of the illumination light L11 in the visual field of the detector 21 for inspection and the luminance of the illumination light L11 acquired by the detector 32 for correction. Then, the processing unit 40 inspects the object 51 to be inspected by using the corrected image data of the object 51 to be inspected.

Further, the processing unit 40 may include the position recording shift register 41 and the luminance register 42. The position recording shift register 41 records the positions of a plurality of pixels arranged in the transfer direction on the light receiving surface of the detector 21 for inspection at each emission timing of the light source 11. The luminance register 42 records the luminance of light received by the detector 32 for correction at each emission timing of the light source 11. The position recording shift register 41 and the luminance register 42 are described later.

Inspection Method

Figure 6:
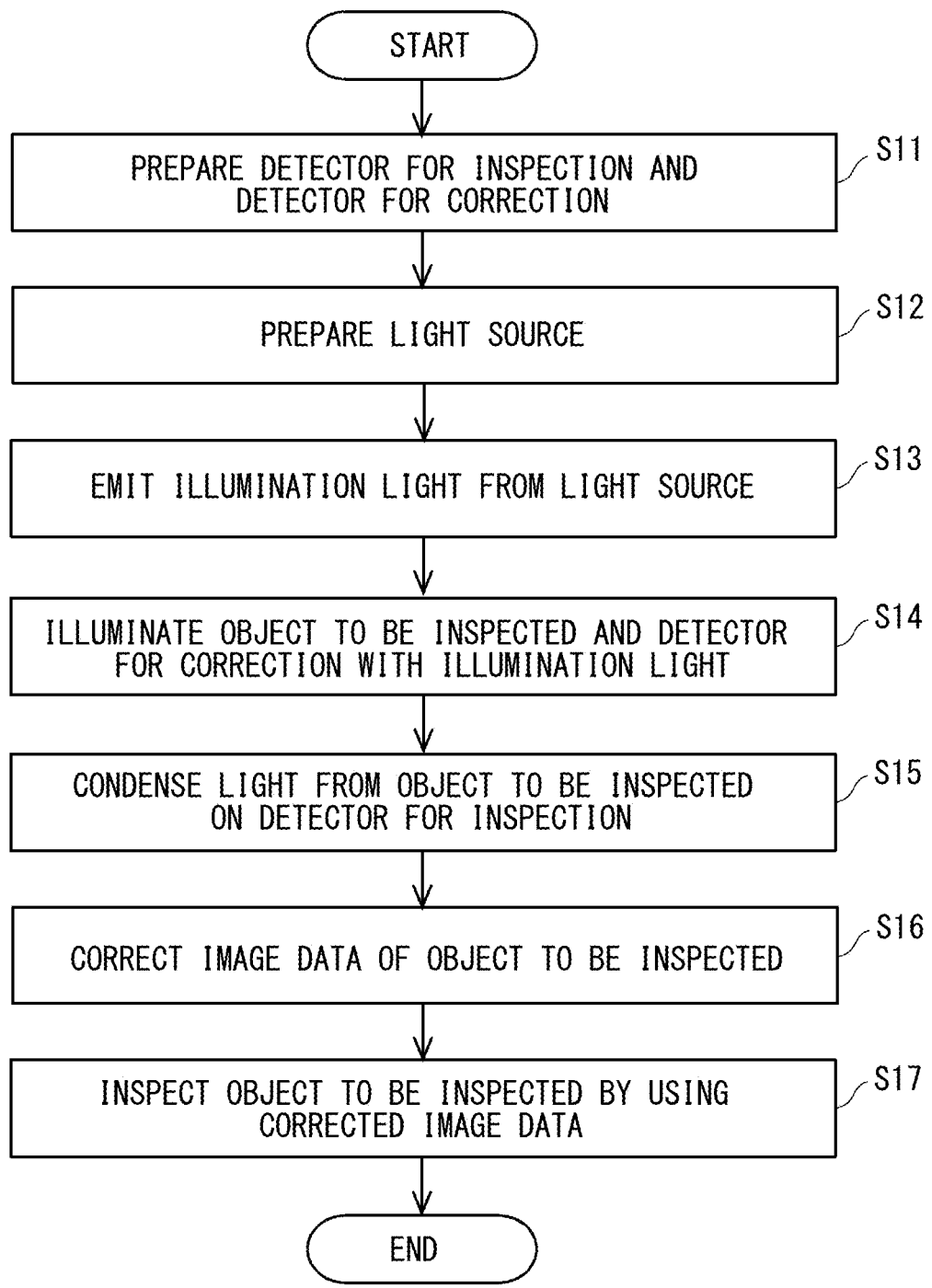
FIG. 6 is a flowchart illustrating an inspection method according to an embodiment.

A detection method using the inspection device 1 is described hereinafter. FIG. 6 is a flowchart illustrating an inspection method according to an embodiment. First, as shown in Step S11 of FIG. 6, the detector 21 for inspection and the detector 32 for correction are prepared. The detector 21 for inspection is a detector including a TDI sensor, for example. The detector 21 for inspection contains a plurality of pixels arranged on the light receiving surface including the transfer direction and a direction orthogonal to the transfer direction. The detector 21 for inspection acquires image data by transferring charge produced by light received by the plurality of pixels in the transfer direction at a specified transfer timing. The detector 32 for correction is a detector including a photodiode, for example. The detector 32 for correction acquires the luminance of received light.

Next, the light source 11 is prepared as shown in Step S12. The light source 11 emits illumination light containing pulsed light. The light source 11 is an LPP type that applies laser light to the droplet generated in the release period of the DG 11a and thereby emits the illumination light L11, for example.

Then, as shown in Step S13, the light source 11 emits the illumination light L11. At this time, the pulse enable circuit 12 controls whether or not to apply the plasma-producing laser light 11c to the droplet 11b generated in the release period of the DG 11a. To be specific, the pulse enable circuit 12 predicts the next emission timing based on a signal from the detector that detects the passage of the droplet 11b, compares the predicted emission timing with the next transfer timing of the TDI sensor, and only when they do not overlap, gives an emission trigger to the plasma-producing laser light source to apply the plasma-producing laser light 11c and thereby emit the illumination light L11. Specifically, the pulse enable circuit 12 causes the light source 11 to emit the illumination light L11 only when it determines to allow the light source 11 to emit the illumination light L11.

Figure 7:
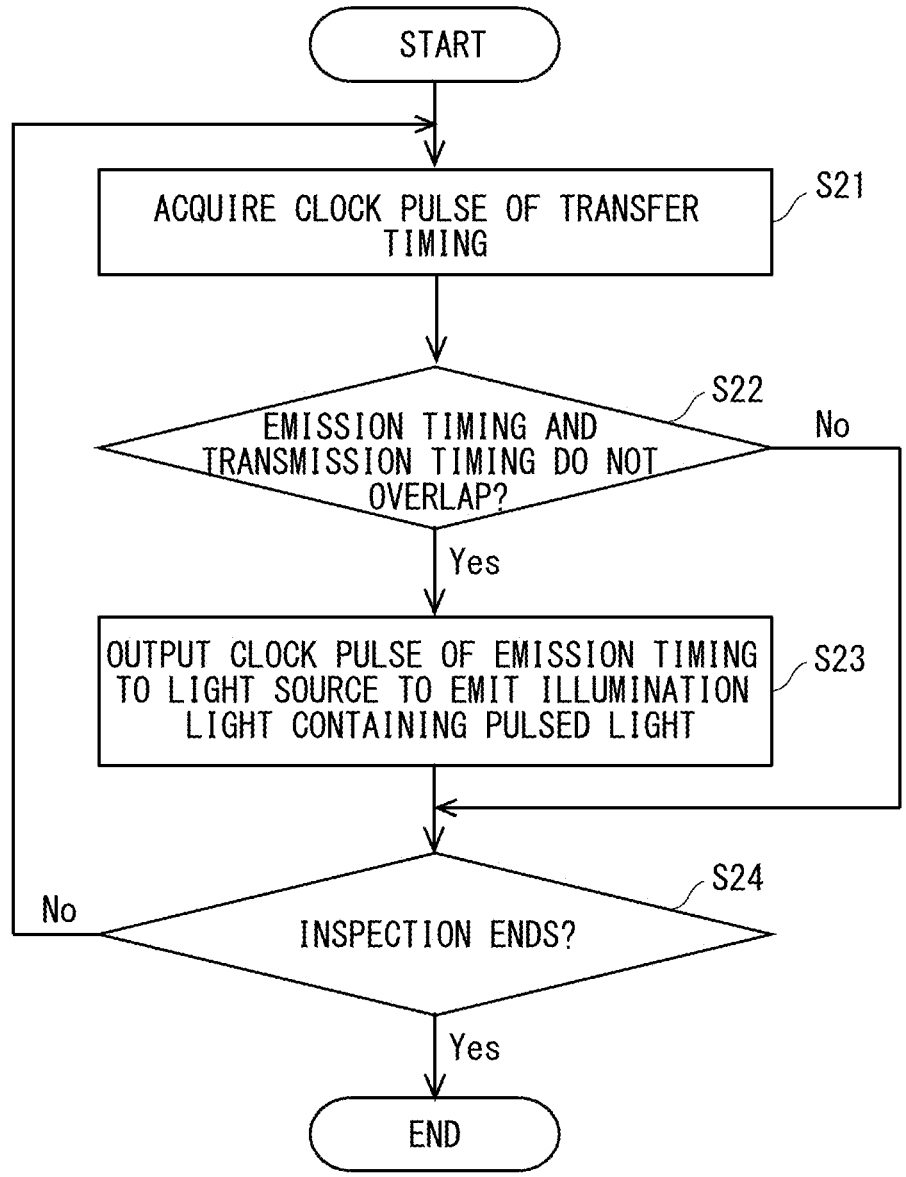
FIG. 7 is a flowchart illustrating a control method of emission timing in a light source that emits pulsed light according to an embodiment.

FIG. 7 is a flowchart illustrating a method of controlling whether or not to emit light in a light source that emits pulsed light according to an embodiment. As shown in Step S21 of FIG. 7, the pulse enable circuit 12 acquires a clock pulse at the transfer timing of the TDI sensor for a given length of time and calculates the average pulse interval. The pulse enable circuit 12 then adds the average pulse interval to the time of the transfer clock pulse received last time and thereby predicts the next transfer timing.

Then, as shown in Step S22, the pulse enable circuit 12 determines whether or not the emission timing of the light source 11 and the transfer timing overlap. To be specific, the pulse enable circuit 12 detects the passage time of the droplet 11b by detection laser light 11e and 11f. The pulse enable circuit 12 then calculates the velocity of the droplet 11b based on each passage time and predicts the time when the droplet 11b reaches the condensing point of the plasma-producing laser light 11c. The pulse enable circuit 12 compares the next emission timing predicted in this manner with the next transfer timing predicted in Step S21, and determines whether the transfer time $\tau_{Tt}$ and the pulsed light duration $\tau_p$ overlap or not.

When the emission timing does not overlap (Yes), the pulse enable circuit 12 outputs a clock pulse of the emission timing to the plasma-producing laser light source as shown in Step 23. The droplet 11b is thereby irradiated with the plasma-producing laser light 11c to emit the illumination light L11 containing pulsed light. In this manner, the pulse enable circuit 12 controls whether or not to emit light by controlling the irradiation of the laser light 11c.

Then, as shown in Step 24, the pulse enable circuit 12 determines whether inspection of the object 51 to be inspected ends or not. When, on the other hand, the emission timing of the light source 11 overlaps (No), the process proceeds to Step S24. Specifically, the pulse enable circuit 12 does not output a clock pulse of the emission timing to the light source 11. This inhibits emission of the illumination light L11 containing pulsed light.

In Step S24, when inspection of the object 51 to be inspected does not end (No), the process returns to Step S21, and the pulse enable circuit 12 acquires a clock pulse of the transfer timing of the TDI sensor, and then the process proceeds to Step S22. On the other hand, in Step S24 when inspection of the object 51 to be inspected ends (Yes), the process ends. In this manner, the pulse enable circuit 12 controls whether or not to emit light based on the transfer timing.

Figure 14:
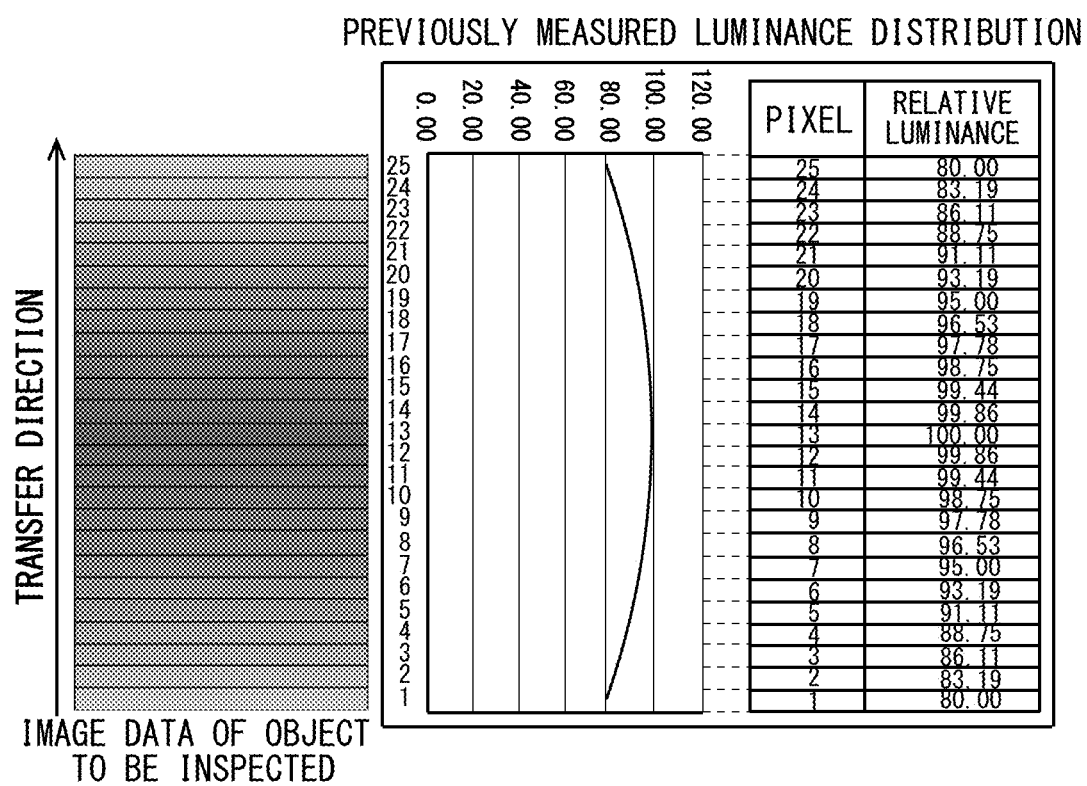
FIG. 14 is a graph illustrating previously measured luminance distribution according to an embodiment, where the vertical axis indicates the position of each pixel of a TDI sensor and the horizontal axis indicates luminance.

Then, as shown in FIG. 14 of FIG. 6, the object 51 to be inspected is illuminated with the illumination light L11. To be specific, the object 51 to be inspected is illuminated by the illumination optical system 10 using the illumination light L11. Further, the detector 32 for correction is illuminated, and a part of the illumination light condenses on the detector 32 for correction, and thereby the luminance of illumination light is acquired. After that, as shown in Step S15, light from the object 51 to be inspected illuminated with the illumination light L11 condenses on the detector 21 for inspection, and thereby image data of the object 51 to be inspected is acquired.

After that, as shown in Step S16, the processing unit 40 corrects the image data of the object 51 to be inspected. The processing unit 40 corrects the image data of the object 51 to be inspected by using the previously measured luminance distribution of the illumination light L11 on the light receiving surface and the luminance of the illumination light at each emission timing acquired by the detector 32 for correction. The processing unit 40 may prepare the position recording shift register 41 and the luminance register 42 and correct the image data of the object 51 to be inspected by using the position recording shift register 41 and the luminance register 42.

Figure 8:
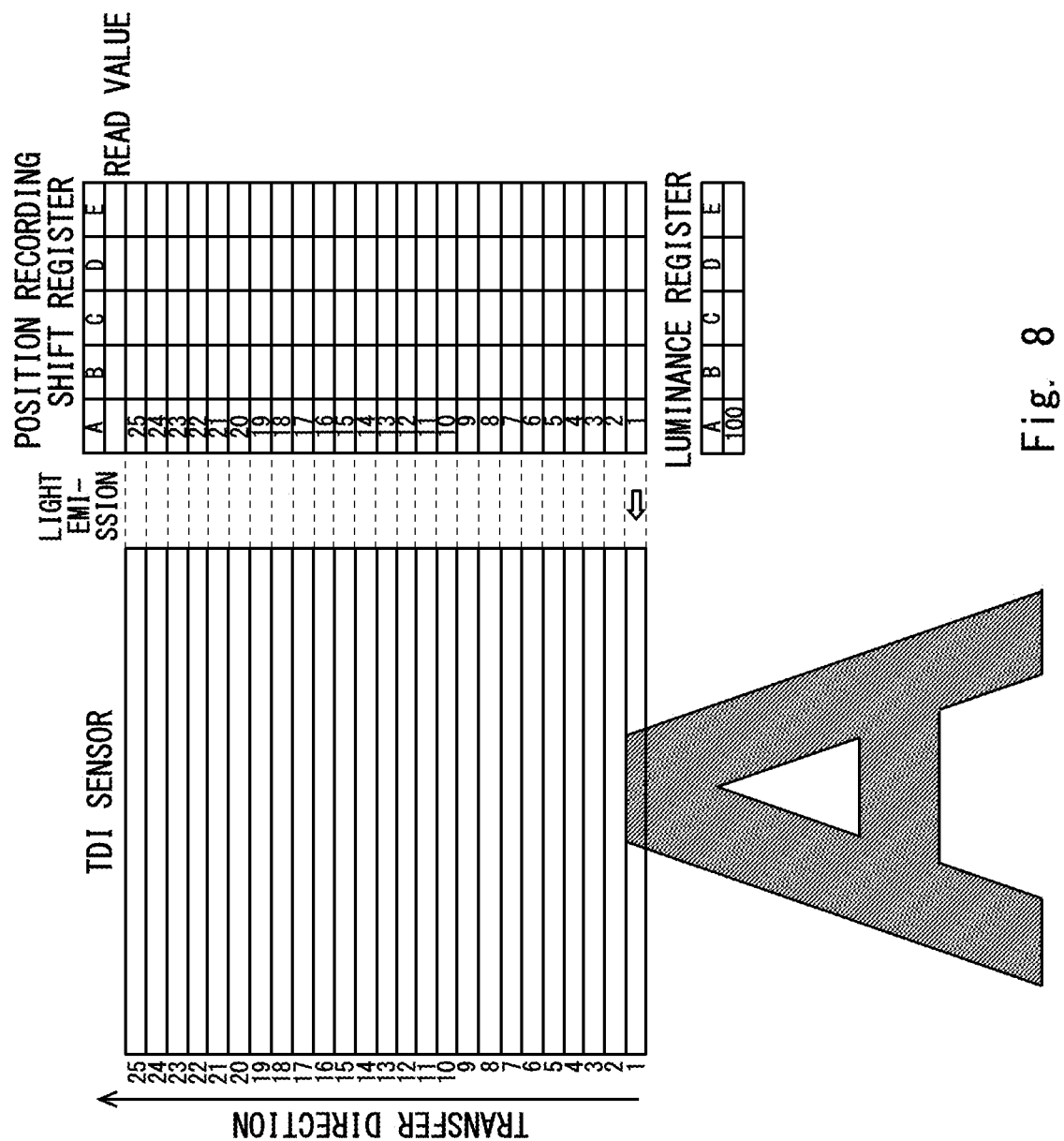
FIG. 8 is a view illustrating the operation of a position recording shift register and a luminance register in a processing unit according to an embodiment.

FIGS. 8 to 13 are views illustrating the operation of the position recording shift register 41 and the luminance register 42 of the processing unit 40 according to an embodiment. As shown in FIG. 8, in the case where a TDI sensor is used as the detector 21 for inspection, a plurality of pixels arranged in the transfer direction and the direction orthogonal to the transfer direction are placed in the visual field of the TDI sensor. In the figures, only the pixels in the transfer direction are sorted out. The numbers 1 to 25 are sequentially assigned to the respective pixels along the transfer direction. The numbers 1 to 25 indicate the positions of the respective pixels. Note that the numbers 1 to 25 indicating the positions of the pixels in the transfer direction are shown by way of illustration only.

The processing unit 40 includes the position recording shift register 41 and the luminance register 42. The position recording shift register 41 has the same length as the number of pixels in the transfer direction. The position recording shift register 41 records the numbers of the plurality of pixels arranged in the transfer direction at each emission timing.

The processing unit 40 may include a plurality of position recording shift registers A to E. The position recording shift registers A to E are shown by way of illustration only, and the number of position recording shift registers is preferably equal to or more than the number of times the light source 11 emits light during a time of integration of charge of the plurality of pixels included in the TDI sensor (which is referred to as an integration time). This allows a plurality of position recording shift registers to respectively correspond to a plurality of pulsed light emitted from the light source 11 during the integration time. Note that the reference numeral 41 is used to collectively refer to the position recording shift register 41, and the reference symbol A to E is used to indicate a particular position recording shift register among the plurality of position recording shift registers 41.

The luminance register 42 records the luminance of light received by the detector 32 for correction, which is pulse emission luminance, immediately after pulse emission. The processing unit 40 may include a plurality of luminance registers. The number of luminance registers is also preferably equal to or more than the number of times the light source 11 emits light during the integration time, just like the case of the position recording shift register 41. This allows a plurality of luminance registers to respectively correspond to a plurality of pulsed light emitted from the light source 11 during the integration time. Note that, in the case of the luminance register 42 also, the reference numeral 42 is used to collectively refer to the luminance register 42, and the reference symbol A to E is used to indicate a particular luminance register among the plurality of luminance registers 42.

As shown in FIG. 8, at the first emission timing, the numbers 1 to 25 of the plurality of pixels arranged in the transfer direction are recorded in the position recording shift register A. Further, at the first emission timing, the luminance "100" of pulsed light received by the detector 32 for correction, is recorded in the luminance register A. After that, the processing unit 40 shifts the numbers 1 to 25 of the pixels recorded in the position recording shift register A in the transfer direction in synchronization with the transfer timing of the TDI sensor.

Figure 9:
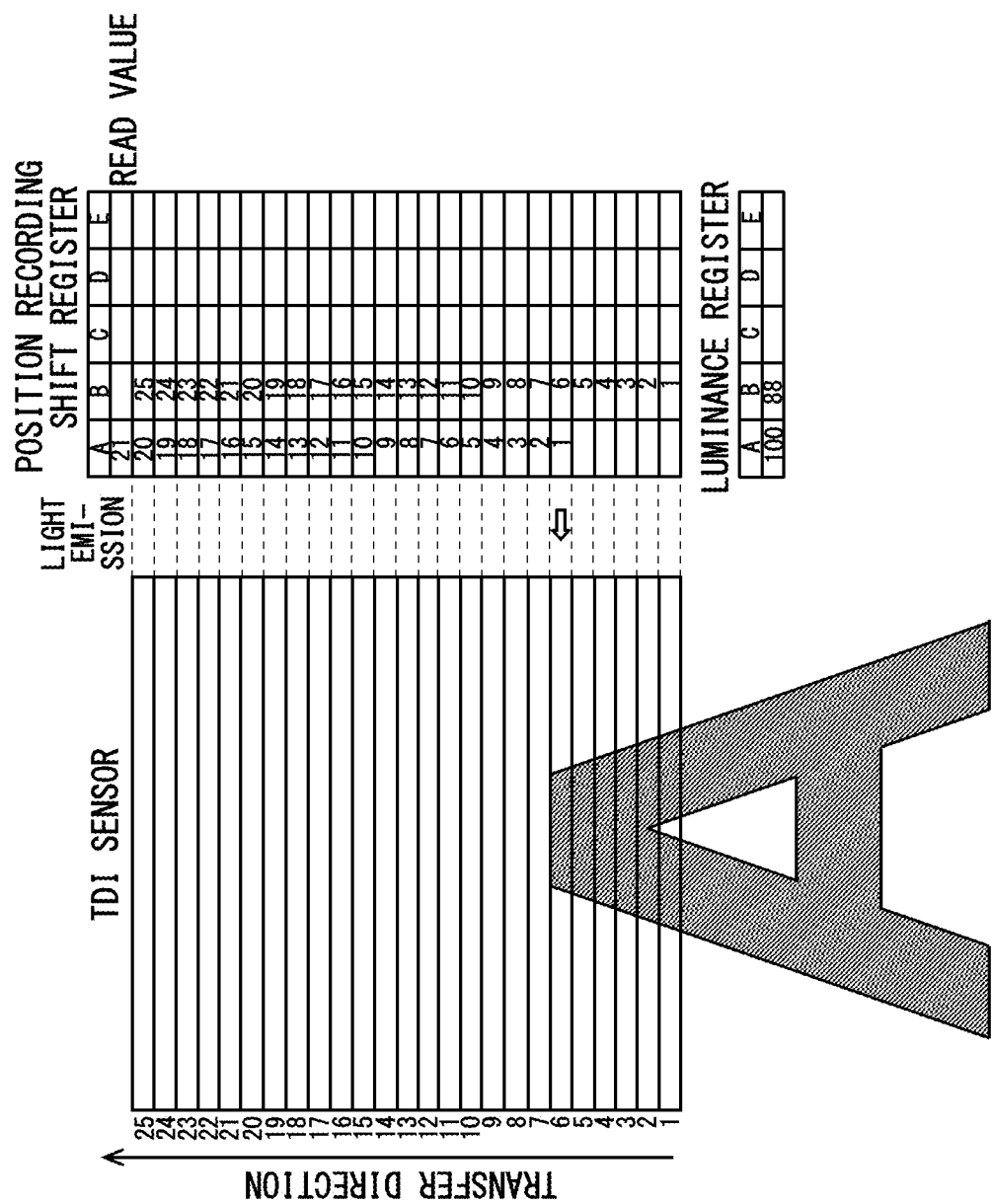
FIG. 9 is a view illustrating the operation of the position recording shift register and the luminance register in the processing unit according to an embodiment.

Next, as shown in FIG. 9, at the second emission timing, the numbers 1 to 25 of the plurality of pixels arranged in the transfer direction are recorded in the position recording shift register B. In the position recording shift register A, the numbers of the respective pixels are shifted in the transfer direction by the amount of five-time transfer from the first emission timing. Further, at the second emission timing, the luminance "88" of pulsed light received by the detector 32 for correction is recorded in the luminance register B.

Figure 10:
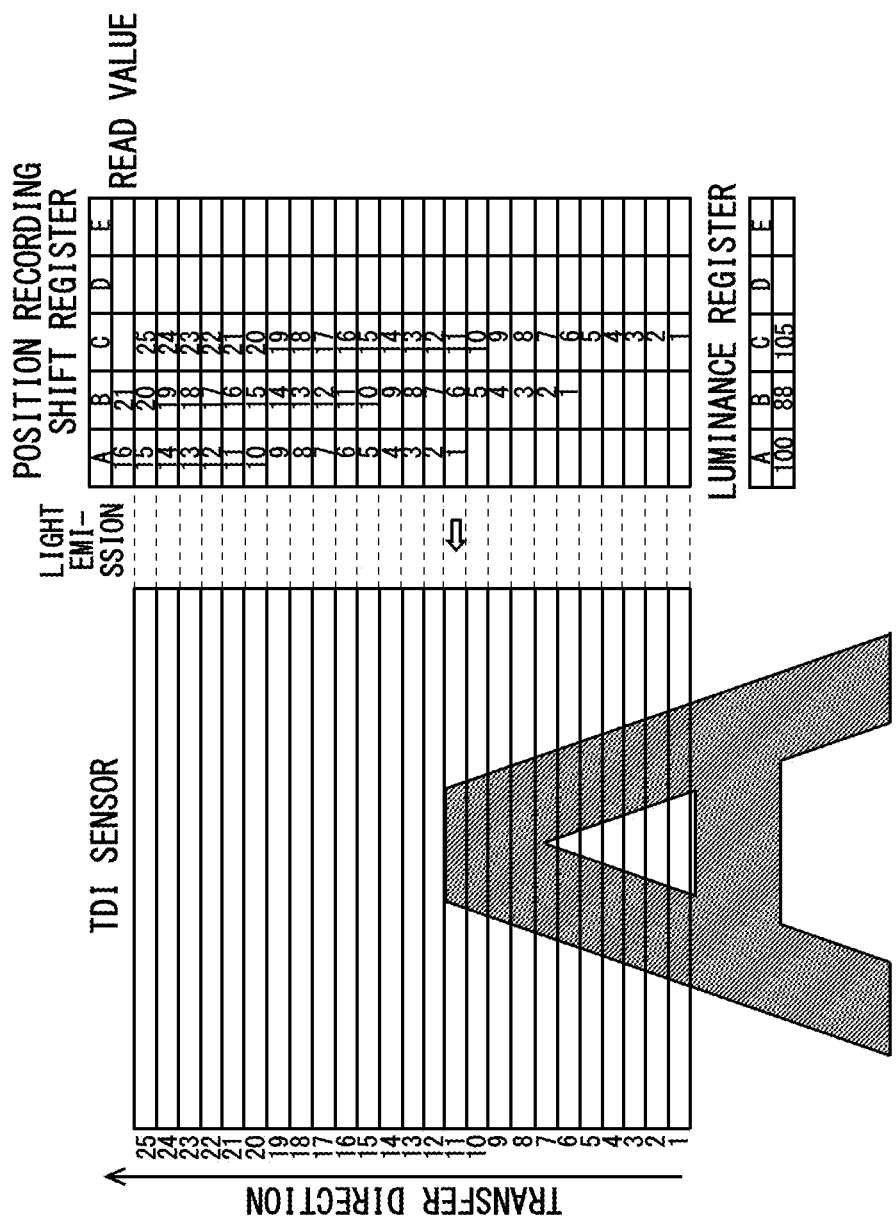
FIG. 10 is a view illustrating the operation of the position recording shift register and the luminance register in the processing unit according to an embodiment.

Then, as shown in FIG. 10, at the third emission timing, the numbers 1 to 25 of the plurality of pixels arranged in the transfer direction are recorded in the position recording shift register C. In the position recording shift registers A and B, the numbers of the respective pixels are shifted in the transfer direction by the amount of five-time transfer from the second emission timing. Further, at the third emission timing, the luminance "105" of pulsed light received by the detector 32 for correction is recorded in the luminance register C.

Figure 11:
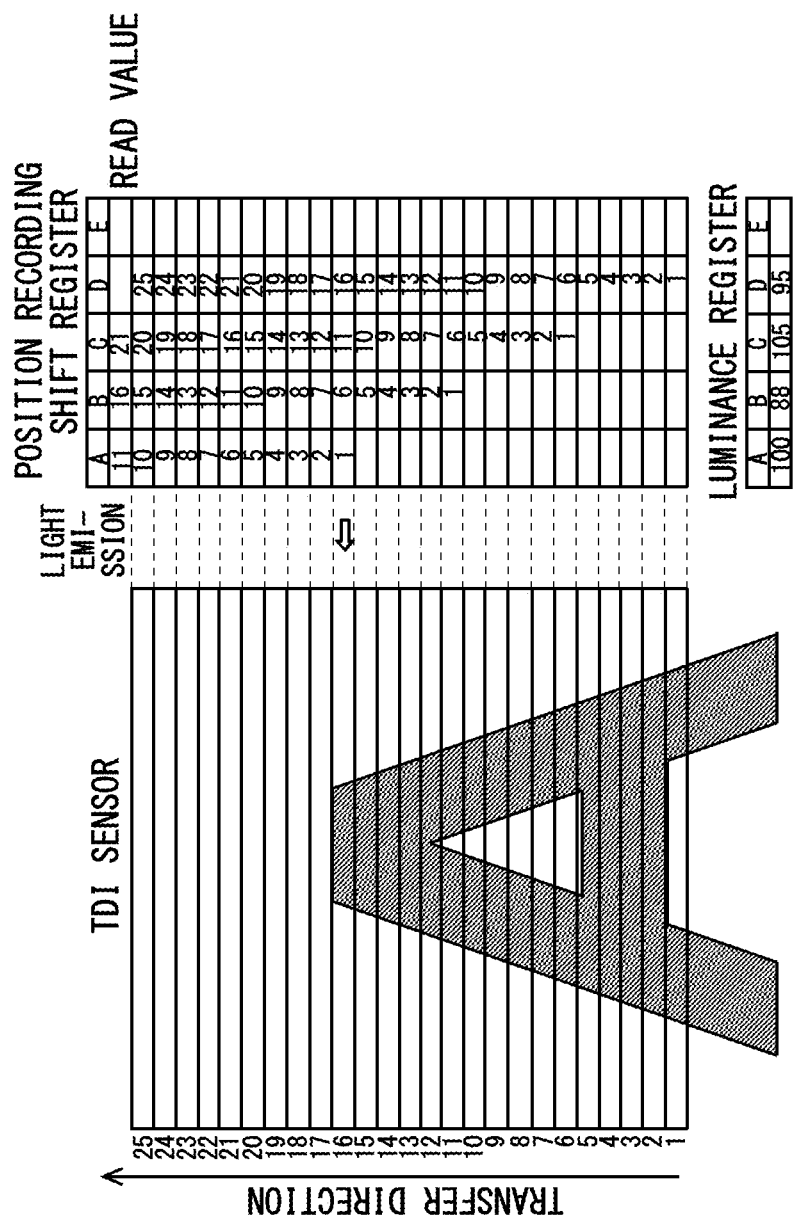
FIG. 11 is a view illustrating the operation of the position recording shift register and the luminance register in the processing unit according to an embodiment.

As shown in FIG. 11, at the fourth emission timing, the numbers 1 to 25 of the plurality of pixels arranged in the transfer direction are recorded in the position recording shift register D. In the position recording shift registers A to C, the numbers of the respective pixels are shifted in the transfer direction by the amount of five-time transfer from the third emission timing. Further, at the fourth emission timing, the luminance "95" of pulsed light received by the detector 32 for correction is recorded in the luminance register D.

Figure 12:
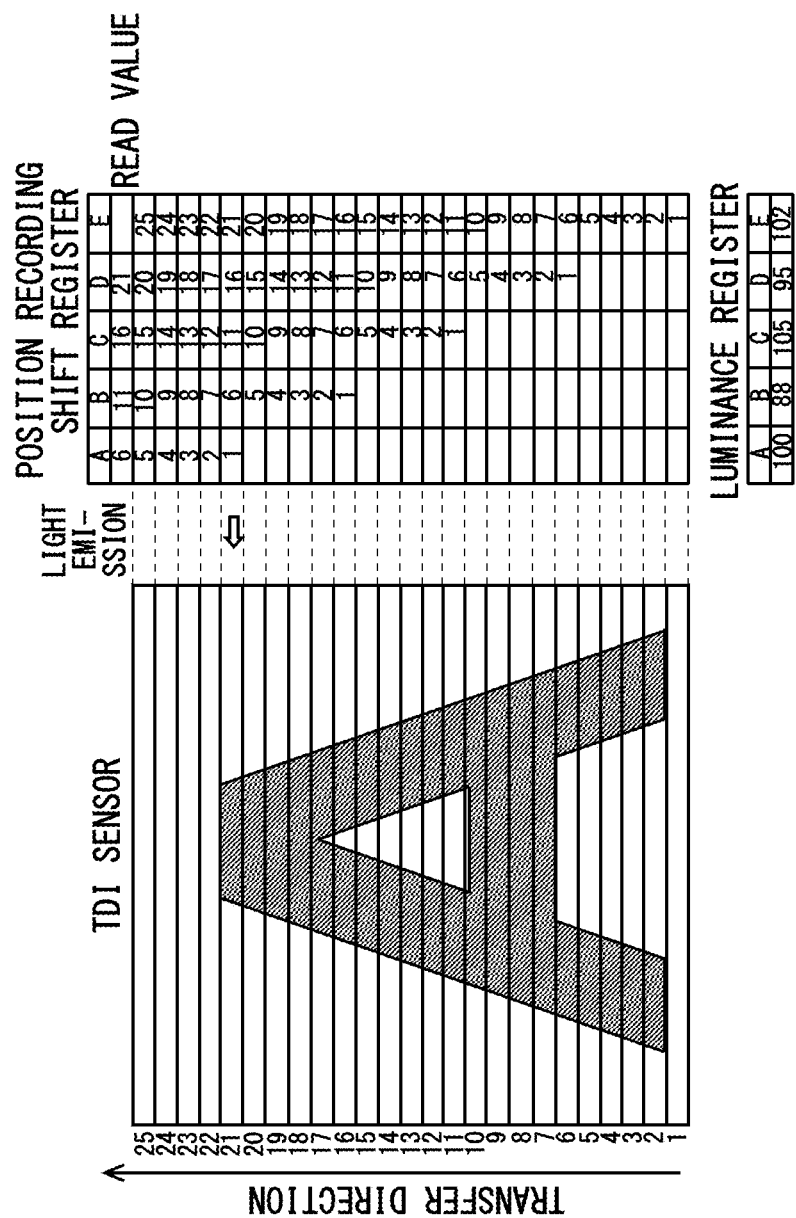
FIG. 12 is a view illustrating the operation of the position recording shift register and the luminance register in the processing unit according to an embodiment.

As shown in FIG. 12, at the fifth emission timing, the numbers 1 to 25 of the plurality of pixels arranged in the transfer direction are recorded in the position recording shift register E. In the position recording shift registers A to D, the numbers of the respective pixels are shifted in the transfer direction by the amount of five-time transfer from the fourth emission timing. Further, at the fifth emission timing, the luminance "102" of pulsed light received by the detector 32 for correction is recorded in the luminance register E.

Figure 13:
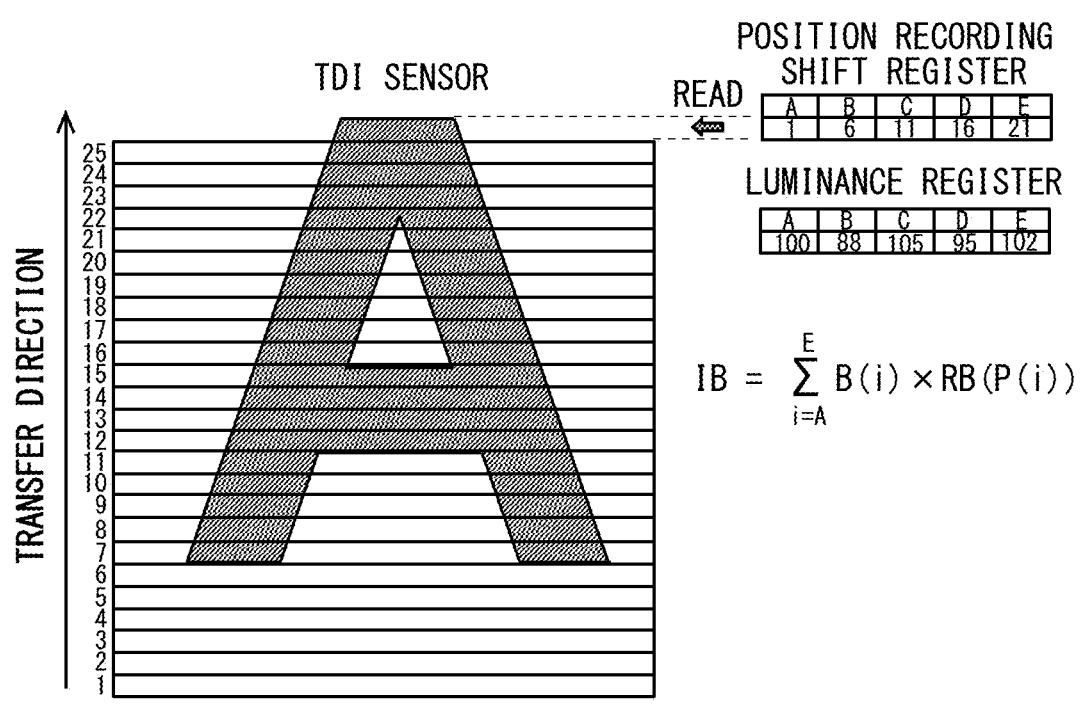
FIG. 13 is a view illustrating the operation of the position recording shift register and the luminance register in the processing unit according to an embodiment.

As shown in FIG. 13, the values of the position recording shift registers A to E are read at the end of the light receiving surface in the transfer direction. The values of the luminance registers A to E are also read at the same time. For example, in a part including the upper end of the letter A in the object 51 to be inspected, the pixel positions 1, 6, 11, 16 and 21 are recorded in the position recording shift registers A to E, respectively. Further, the luminance 100, 88, 105, 95 and 102 are recorded in the luminance registers A to E, respectively.

As shown in FIG. 14, the luminance distribution of the illumination light L11 on the light receiving surface is measured before inspection using the image data of the object 51 to be inspected or before correction of the image data of the object 51 to be inspected. Then, the processing unit 40 stores the previously measured luminance distribution on the light receiving surface. The luminance distribution of the illumination light L11 on the light receiving surface may be measured by the TDI sensor, for example.

FIG. 14 is a graph illustrating the previously measured luminance distribution according to an embodiment, where the vertical axis indicates the position of each pixel of a TDI sensor and the horizontal axis indicates luminance. On the left of the graph in FIG. 14, the position of each pixel in the transfer direction in the visual field of the TDI sensor is shown. On the right of the graph, the relative luminance of each pixel is shown.

In the plurality of position recording shift registers A to E and the plurality of luminance registers A to E of the processing unit 40, the light emitting spot and the emission luminance of each of a plurality of pulsed light emitted by the light source 11 during the integration time are recorded. In this case, the integrated luminance D3 of the read pixel is derived by the following equation (1).

$$IB = \sum_{i=A}^{E} B(i) \times RB(P(i)) \quad (1)$$

In the above equation, RB(j) is the previously measured luminance distribution. For example, it is the relative luminance distribution at a pixel position in the transfer direction of the TDI sensor as shown in FIG. 14. P(i) is the value of each of the position recording shift registers A to E, which is a pixel position in the transfer direction of the TDI sensor. B(i) is the value of each of the luminance registers A to E, which is the relative luminance normalized by the previously measured luminance. The integrated luminance IB is derived in this way.

As described above, when correcting image data of the object 51 to be inspected, the processing unit 40 calculates the integrated luminance IB by using the numbers of the pixels in the position recording shift registers A to E shifted to the end in the transfer direction and output, the luminance of light recorded in the luminance registers A to E, and the previously measured luminance distribution of the illumination light L11 on the light receiving surface. The processing unit 40 then corrects the image data of the object 51 to be inspected by using the integrated luminance IB.

After that, as shown in FIG. 17 of FIG. 6, the object to be inspected is inspected by using the corrected image data. The processing unit 40 inspects defect of a pattern or the like formed on the object 51 to be inspected by using the corrected image data. In this manner, the object 51 to be inspected is inspected using the inspection device 1.

When calculating the integrated luminance IB of a pixel, a parameter whose value is different from pixel to pixel and which affects the integrated luminance IB, such as sensitivity variation in pixels of a TDI sensor, may be incorporated into calculation. For example, when sensitivity variation in pixels of a TDI sensor is RS(j), the value of IB may be calculated as the following equation (2).

$$IB = \sum_{i=A}^{E} B(i) \times RB(P(i)) \times RS(P(i)) \quad (2)$$

The effects of this embodiment are described hereinbelow.

The inspection device 1 of this embodiment includes the pulse enable circuit 12 that controls whether or not to emit light.

Figure 15:
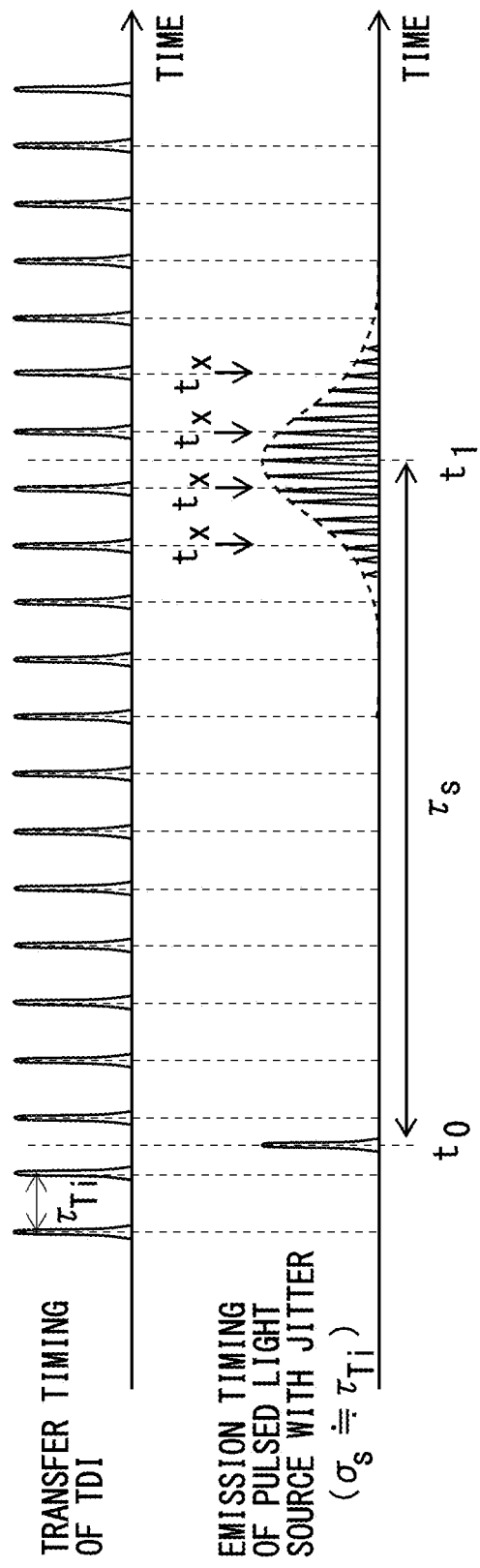
FIG. 15 is a graph illustrating the transfer timing of a TDI sensor and the emission timing of a light source that emits pulsed light containing jitter according to an embodiment, where the horizontal axis indicates time and the vertical axis indicates the frequency of occurrence of a clock pulse.
Figure 16:
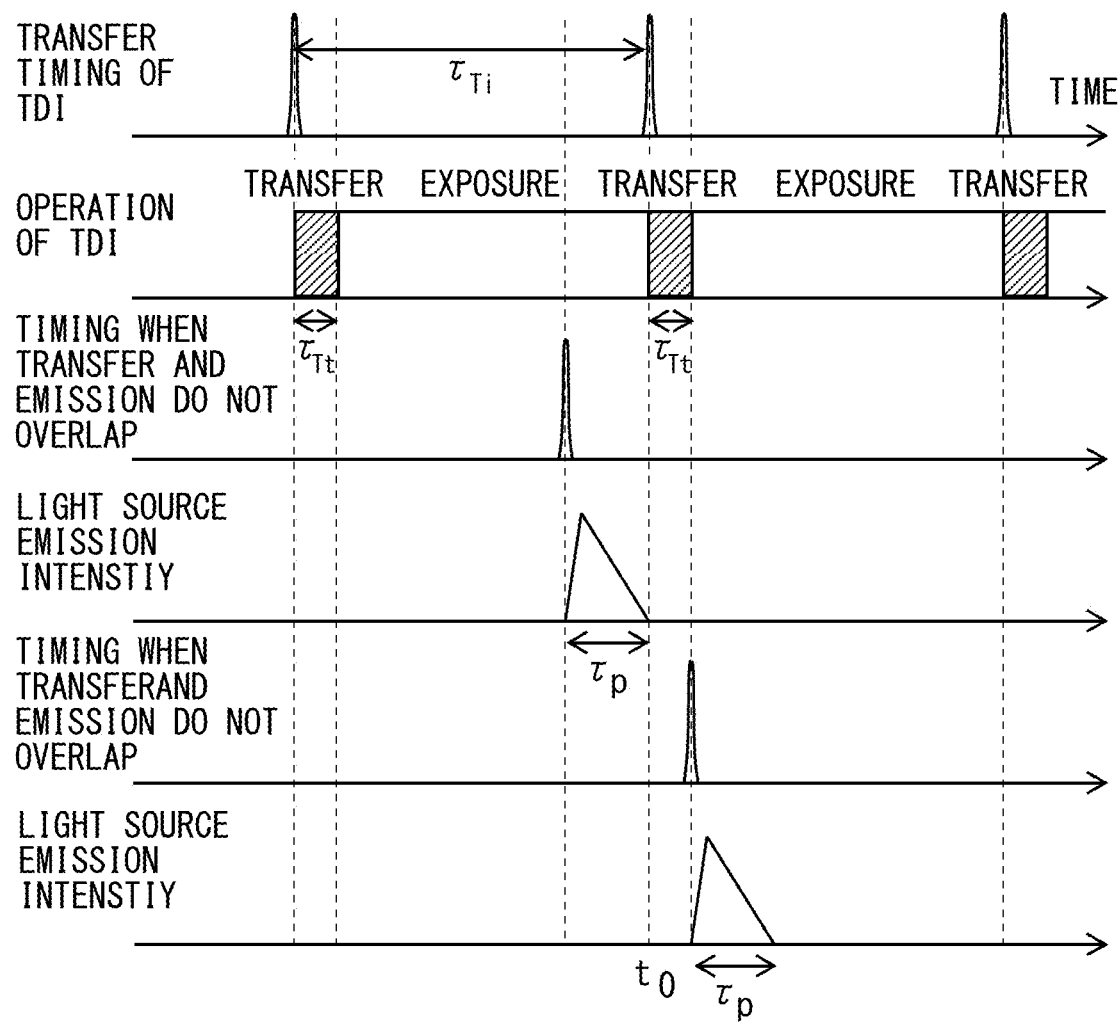
FIG. 16 is a view illustrating the transfer timing of a TDI sensor, the operation of the TDI sensor, the emission timing of a light source, and the emission intensity of the light source according to an embodiment.

FIG. 15 is a graph illustrating the transfer timing of a TDI sensor and the emission timing of the light source 11 that emits pulsed light containing jitter according to an embodiment, where the horizontal axis indicates time and the vertical axis indicates the frequency of occurrence of a clock pulse. FIG. 16 is a view illustrating the transfer timing of a TDI sensor, the operation of the TDI sensor, the emission timing of the light source 11, and the emission intensity of the light source 11 according to an embodiment.

As shown in FIG. 15, in this embodiment, the pulse enable circuit 12 inhibits emission of the illumination light L11 containing pulsed light at time $t_X$ when the transfer timing and the emission timing of emitting pulsed light overlap. This prevents overlap of the transfer period TT, and the duration $\tau_p$ as shown in FIG. 16. Therefore, even when the emission period of pulsed light emitted from the light source 11 contains significant jitter, charge produced in a pixel is not split into adjacent pixels because the transfer timing and the emission timing do not overlap. This enables accurate acquisition of the integrated light intensity and accurate luminance correction of image data of an object to be inspected.

Further, the inspection device 1 uses an LPP light source as the light source 11 and applies the plasma-producing laser light 11c to the center of the droplet. Therefore, even when the luminance of the illumination light L11 varies with time, the luminance distribution of the illumination light L11 does not substantially vary with time. This enables luminance correction in consideration of luminance distribution even with use of the detector 32 for correction in a simple structure.

Further, because the position recording shift register 41 and the luminance register 42 record the pixel positions and the emission luminance at emission timing, the luminance at light receiving pixel position can be acquired even when illumination light has non-uniform luminance distribution. This enables accurate luminance correction.

The position recording shift register 41 and the luminance register 42 record the light receiving spots and the luminance of a plurality of pulsed light emitted from the light source 11 during an integration time. This enables accurate calculation and integration of luminance at the light receiving spot of each pulsed light. The luminance of image data of the object to be inspected is thereby corrected with high accuracy. Because the object 51 to be inspected is inspected by using the corrected image data of the object 51 to be inspected, the object 51 to be inspected is inspected with high accuracy.

When acquiring the luminance of the illumination light L11, a part of the illumination light L11 between the dropping mirror 14 that allows the illumination light L11 to enter the object 51 to be inspected and the reflecting mirror that allows the illumination light L11 to enter the dropping mirror 14 as converging light is extracted by the cut mirror 31. Therefore, the luminance of the illumination light L11 can be acquired without reducing the amount of light of the illumination light L11 that illuminates the object 51 to be inspected. For example, the luminance of the illumination light L11 can be acquired by the detector 32 for correction without degradation of the inspection accuracy of the object 51 to be inspected by reducing a part of the cross-sectional area of the cross section orthogonal to the optical axis of the illumination light L11 at the position where the cut mirror 31 is placed to be smaller than the other part of the cross-sectional area, for example.

Although embodiments of the present disclosure are described in the foregoing, the present disclosure involves appropriate modifications without impairment of its object and effects and is not restricted to the above-described embodiments.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

The invention claimed is:

1. An inspection device comprising: a detector for inspection configured to include a plurality of pixels arranged on a light receiving surface including a transfer direction and a direction orthogonal to the transfer direction, and acquire image data by transferring charge produced by light received by the plurality of pixels in the transfer direction at a specified transfer timing; a light source configured to emit illumination light including pulsed light; a pulse enable circuit configured to control an emission timing for the light source to emit the illumination light based on the transfer timing; an illumination optical system configured to illuminate an object to be inspected with the illumination light; a condensing optical system configured to condense, on the detector for inspection, light from the object to be inspected illuminated with the illumination light; and a processing unit configured to inspect the object to be inspected by using the image data of the object to be inspected.

2. The inspection device according to claim 1, wherein the light source is an LPP light source configured to emit the illumination light by applying laser light to a droplet generated at a generation timing asynchronous to the transfer timing, and the pulse enable circuit controls the emission timing by controlling application of the laser light.

3. The inspection device according to claim 1, further comprising: a monitor unit configured to acquire luminance of the illumination light detected by illuminating a detector for correction with a part of the illumination light, wherein the processing unit corrects the image data of the object to be inspected by using a previously measured luminance distribution of the illumination light on the light receiving surface and luminance of the illumination light at the emission timing acquired by the detector for correction, and the processing unit inspects the object to be inspected by using the corrected image data of the object to be inspected.

4. The inspection device according to claim 3, wherein the processing unit comprises: a position recording shift register configured to record positions of the plurality of pixels arranged in the transfer direction at the emission timing; and a luminance register configured to record luminance of the illumination light at the emission timing, wherein the processing unit corrects the image data of the object to be inspected by using the previously measured luminance distribution of the illumination light on the light receiving surface, positions of pixels recorded in the position recording shift register, and luminance of the illumination light recorded in the luminance register.

5. The inspection device according to claim 4, wherein the processing unit includes a plurality of the position recording shift registers and a plurality of the luminance registers corresponding to a plurality of pulsed light emitted from the light source during a time of integration of charge of the plurality of pixels, the processing unit shifts positions of the respective pixels recorded in each of the position recording shift registers in the transfer direction in synchronization with the transfer timing, and the processing unit corrects image data of the object to be inspected by using the positions shifted and output in each of the position recording shift registers, luminance of the illumination light recorded in each of the luminance registers, and the previously measured luminance distribution of the illumination light on the light receiving surface.

6. The inspection device according to claim 3, wherein the detector for inspection is a detector including a TDI sensor, and the detector for correction is a detector including a photodiode.

7. An inspection method comprising: a step of preparing a detector for inspection configured to include a plurality of pixels arranged on a light receiving surface including a transfer direction and a direction orthogonal to the transfer direction, and acquire image data by transferring charge produced by light received by the plurality of pixels in the transfer direction at a specified transfer timing; a step of preparing a light source configured to emit illumination light including pulsed light; a step of emitting the illumination light from the light source while controlling emission timing for the light source to emit the illumination light based on the transfer timing; a step of illuminating an object to be inspected with the illumination light; a step of condensing, on the detector for inspection, light from the object to be inspected illuminated with the illumination light; and a step of inspecting the object to be inspected by using the image data of the object to be inspected.

8. The inspection method according to claim 7, wherein the step of preparing a light source configured to emit illumination light including pulsed light prepares an LPP light source configured to emit the illumination light by applying laser light to a droplet generated at a generation timing asynchronous to the transfer timing, and the step of emitting the illumination light controls the emission timing by controlling application of the laser light.

9. The inspection method according to claim 7, further comprising a step of preparing a detector for correction configured to acquire luminance of the illumination light; a step of acquiring luminance of the illumination light by illuminating the detector for correction with a part of the illumination light; and a step of correcting the image data of the object to be inspected by using a previously measured luminance distribution of the illumination light on the light receiving surface and luminance of the illumination light at the emission timing acquired by the detector for correction, wherein the step of inspecting the object to be inspected inspects the object to be inspected by using the corrected image data of the object to be inspected.

10. The inspection method according to claim 9, wherein the step of correcting the image data of the object to be inspected prepares a position recording shift register configured to record positions of the plurality of pixels arranged in the transfer direction at the emission timing, and a luminance register configured to record luminance of the illumination light at the emission timing, and corrects the image data of the object to be inspected by using a previously measured luminance distribution of the illumination light on the light receiving surface, positions of pixels recorded in the position recording shift register, and luminance of the illumination light recorded in the luminance register.

11. The inspection method according to claim 10, wherein the step of correcting the image data of the object to be inspected prepares a plurality of the position recording shift registers and a plurality of the luminance registers corresponding to a plurality of pulsed light emitted from the light source during a time of integration of charge of the plurality of pixels, shifts positions of the respective pixels recorded in each of the position recording shift registers in the transfer direction in synchronization with the transfer timing, and corrects image data of the object to be inspected by using the positions shifted and output in each of the position recording shift registers, luminance of the illumination light recorded in each of the luminance registers, and the previously measured luminance distribution of the illumination light on the light receiving surface.

12. The inspection method according to claim 9, wherein the detector for inspection is a detector including a TDI sensor, and the detector for correction is a detector including a photodiode.

\* \* \* \* \*